United States Patent [19]

Sondergeld et al.

[11] Patent Number: 4,604,342

[45] Date of Patent: Aug. 5, 1986

[54] PHOTOPOLYMERIZABLE MIXTURE AND RECORDING MATERIAL PRODUCED FROM IT

[75] Inventors: Manfred A. J. Sondergeld, Muhlheim; Mario Grossa, Dreieich, both of Fed. Rep. of Germany

[73] Assignee: E. I. Du Pont de Nemours and Company, Wilmington, Del.

[21] Appl. No.: 711,251

[22] Filed: Mar. 13, 1985

[30] Foreign Application Priority Data

Mar. 17, 1984 [DE]  Fed. Rep. of Germany ....... 3409821

[51] Int. Cl.$^4$ .......................... G03C 1/68; G03C 1/70
[52] U.S. Cl. ..................................... 430/281; 430/283; 430/288; 430/922; 430/919; 430/916; 430/271; 522/116; 522/117; 522/118; 522/119; 522/123; 522/26; 522/44

[58] Field of Search ................... 204/159.15; 430/281, 430/283, 285, 288, 922, 919, 916, 271; 522/116, 117, 118, 119, 123, 26, 44

[56] References Cited

U.S. PATENT DOCUMENTS 3,870,768  3/1975  Blackwood et al. ........... 204/159.15

FOREIGN PATENT DOCUMENTS 1420958  1/1976  United Kingdom ................ 430/283

Primary Examiner—John E. Kittle
Assistant Examiner—Cynthia Hamilton

[57] ABSTRACT

A photopolymerizable mixture is described which contains the following: a binding agent which is soluble or at least capable of swelling in aqueous-alkaline solutions, a photoinitiator or a photoinitiator system and at least one ethylenically unsaturated monomer, whereby at least one monomer contains an aromatic hydroxyl-, mercapto-, sulfonamide- or a mono-N-substituted sulfonamide group, or combinations thereof.

11 Claims, No Drawings

PHOTOPOLYMERIZABLE MIXTURE AND RECORDING MATERIAL PRODUCED FROM IT

BACKGROUND OF THE INVENTION

Photopolymerizable mixtures and recording materials which are produced from it are predominantly used for the production of printing plates, and relief pictures, as well as resist materials used in the electronic industry for the production of printed circuits.

In order to comply with the requirements of practice, such materials must, particularly if they are to be used as resist materials, exhibit a number of properties which are often very difficult to combine.

It is, for example, required of resist materials, which are to be washed out and where the remaining coating is to be subsequently removed, that the unexposed areas can be quickly washed out with aqueous-alkaline solutions, whereas the exposed areas must be completely resistant towards these developer solutions. During the subsequent processing it must also be possible to remove the exposed areas quickly and without residue using stronger alkaline aqueous solutions. This differentiated solubility behavior of the unpolymerized and polymerized areas is essentially based on the attack of the aqueous-alkaline developer solution on the soluble binding agent in the unexposed areas, in such a way that the hydrophobic monomer, enclosed in the binding agent, is washed out together with the binding agent. In the exposed areas, crosslinking of the monomer protects the binding agent, which is inherently soluble in the developer solution from the hydrophilic action of developer solution.

If the exposed areas are not sufficiently crosslinked, the processing latitude is unacceptably decreased. In addition, the exposed areas may be attacked by the hydrophilic alkaline etching solution and thus perform inadequately as a resist. The more hydrophobic the exposed regions are the better is the quality of the washed out relief. A slight swelling of the polymerized areas in the hydrophilic developer can lead to distortion of very fine line structure and can thus impair reproduction quality. Such quality impairments cannot be reversed even after drying. In addition, the swelling prevents the formation of straight resist sidewalls.

For the production of resist materials which are to be developed and stripped in aqueous-alkaline solutions, it is thus customary to use monomers which are sufficiently hydrophobic that no undesirable swelling occurs during processing, and which in addition strongly crosslink the binding agent in the exposed areas.

It is a disadvantage that the more hydrophobic the photopolymerized layer remaining on the substrate is after the development process, once it has fulfilled its purpose as resist, the more difficult, slow and incomplete is the removal with the hydrophilic stripping solution. Attempts to improve the stripping properties by decreasing the network density, for example by lowering the concentration of the monomer, have shown that the processing latitude is inadmissibly decreased. Addition of low-molecular weight materials, e.g., plasticizers improves the stripping behavior, but this causes a deterioration of the mechanical properties of the material, particularly in tenting applications. In addition, plating baths may be contaminated by extraction of the plasticizers.

Since the alkaline stripping solution cannot directly attack the polymerized areas, the stripping of the known aqueous-alkaline processible materials occurs by decreasing the adhesion between polymerized layer and metallic base by action of the stripping solution. This causes the polymerized layer to peel off in large flakes.

These "peeled off" resist flakes frequently cause interruptions within the stripping machines by clogging pipes, pumps, and the like.

However, it is much more disadvantageous that particularly in the areas of fine line elements or in the areas which were excessively overplated, the adhesion between metallic base and photopolymerized layer is not sufficiently reduced in the time provided by the processing machine. Thus, the printed circuit boards are not completely stripped despite a subsequent spraying process after passing through the stripping machine. This impairs the performance of the subsequent operating cycles and thus also the quality of the printed circuits.

For a good stripping behavior it is thus necessary that the stripping not only occurs completely, but also takes place within the short period of time provided for by the processing machine, From the DE-PS No. 26 11 577 aqueous-alkaline processible photopolymerizable resist materials have become known in which the photopolymerized areas which serve as etching and/or plating resist, are soluble in the aqueous-alkaline stripping solution. Such resist materials can be stripped naturally without any residues. It is, however, a disadvantage that, with regard to the constantly increasing demands of environmental protection, the elimination of the stripping solution, which exhibits a high concentration of dissolved harmful materials, causes considerable difficulties.

It is thus the task of the invention to describe photopolymerizable mixtures and recording materials produced from them which, compared to known aqueous-alkaline processible recording materials, distinguish themselves by improved stripping behavior, which does not impair other properties of the material, such as processing latitude, reproduction quality of fine line elements, or mechanical properties, and with which the stripping solution or the plating baths are not contaminated in an admissible manner by dissolved harmful materials.

This task is achieved by photopolymerizable mixtures and recording materials produced from them of the type mentioned in the beginning, which contain at least one photopolymerizable monomer according to the present invention.

SUMMARY OF THE INVENTION

Thus the subject of the invention is a photopolymerizable mixture as well as a recording material produced from it which contains the following as essential elements:
a water-insoluble binding agent which is soluble or at least capable of swelling in aqueous-alkaline solutions, a photo-initiator or a photoinitiator system and one or several photopolymerizable ethylenically unsaturated monomers.

The photopolymerizable mixture and the recording material produced from it is characterized in that at least one photopolymerizable ethylenically unsaturated monomer contains at least one aromatic hydroxyl, mercapto, sulfonamide group or a mono-N-substituted sulfonamido group, or combinations thereof.

Suitable monomers in the sense of the invention are, for example, compounds which correspond to the following general formulas:

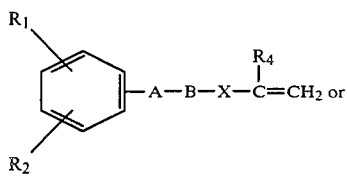

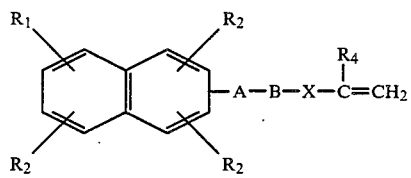

in which
A = a chemical bond; —O—;

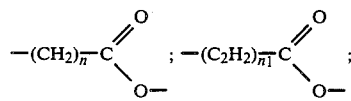

B = a chemical bond; —(CHR$_{3n}$)—O—; —(C$_2$HR$_{3n}$)—
X = a chemical bond;

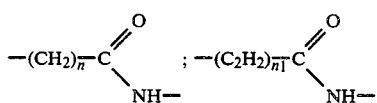

R$_1$ = —OH; —SH; —SO$_2$NHR$_5$,
R$_2$ = H; alkyl with C$_1$-C$_4$; halide; R$_1$; oxyalkyl with C$_1$-C$_4$; nitro; —CN;

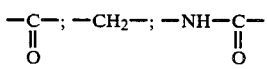

R$_3$ = H;

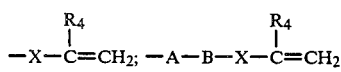

—OH; —SH; —NH$_2$;
R$_4$ = H; alkyl with C$_1$-C$_6$;

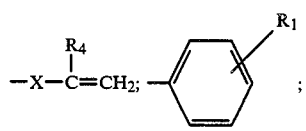

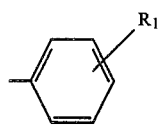

R$_5$ = H; alkyl with C$_1$-C$_6$; phenyl and phenyl substituted with C$_1$-C$_4$ alkyl
n = 0-6
n$_1$ = 1-2

DETAILED DESCRIPTION OF THE INVENTION

Typical monomers which are represented by the preceding formula are:
2-hydroxyphenylacrylate,
3-hydroxyphenylacrylate,
4-hydroxyphenylacrylate,
2-chloro-4-hydroxyhenylacrylate,
3-chloro-4-hydroxyphenylacrylate,
2-methoxy-4-hydroxyphenylacrylate,
3-methoxy-4-hydroxyphenylacrylate,
N-(2-hydroxyphenyl)-acrylamide,
N-(3-hydroxyphenyl)-acrylamide,
N-(4-hydroxyphenyl)-acrylamide,
2-mercaptophenylacrylate,
3-mercaptophenylacrylate,
4-mercaptophenylacrylate,
N-(4-mercaptophenyl)-acrylamide,
N-(2-mercaptophenyl)-acrylamide,
4-acryloylbenzene sulfonic acid amide,
4-acrylamidobenzene sulfonic acid amide,
4-acryloylbenzene sulfonic acid anilide,
4-acrylamidobenzene sulfonic acid anilide,
1,2-di-acryloyl-3-hydroxybenzene,
1,2-di-acryloyl-4-hydroxybenzene,
1,3-di-acryloyl-5-hydroxybenzene,
2,4-di-hydroxyacrylanilide,
O-, m-, p-vinylphenol,
N-methyl-(p-vinyl)-benzene sulfonamide,
1-(2-hydroxybenzoic acid)-2-hydroxy-3-acryloylpropane,
1-(4-hydroxybenzoic acid)-2-hydroxy-3-acryloylpropane,
1-(2,4-dihydroxybenzoic acid)-2-hydroxy-3-acryloylpropane,
1-(3,5-dihydroxybenzoic acid)-2-hydroxy-3-acryloylpropane,
1-(2-hydroxybenzoic acid)-2-acryloylethane,
1-(4-hydroxybenzoic acid)-2-acryloylethane,
1-(2-mercaptobenzoic acid)-2-hydroxy-3-acryloylpropane,
1-(2-hydroxy-3-naphthoic acid)-2-hydroxy-3-acryloylpropane,
2-acryloyl-7-hydroxynaphthaline,
(2-hydroxy-3-acryloylpropyl)-embone acid diester.
Instead of the acryl compounds one can also use the corresponding methacrylic compounds.

Particularly preferred monomers are p-hydroxymethacrylic anilide, hydroquinonemonomethacrylate, 1-(4-hydroxybenzoic acid)-2-hydroxy-3-methacryloylpropane. 1-(2-hydroxybenzoic acid)-2-hydroxy-3-methacryloyl-propane and di-(2-hydroxy-3-acryloylpropyl)-5-hydroxy-isophthalic acid ester.

The described monomers can be produced according to the known methods, for example by reaction of aromatic carboxylic acids substituted with OH—, SH—, or SO$_2$NH$_2$-groups with epoxy-substituted acrylic- and/or methacrylic acid derivatives, or by partial oxygen- and/or sulphur-acylation of multi-functional phenols or thiophenols by acrylic- or methacrylic acid chloride. Subsequently the production of two typical monomers to be used according to the invention is described.

1. The production of hydroquinonemonomethacrylate
220 g (2 mol) hydroquinone and 87 ml (1 mol) methacrylic acid were brought to the reflux temperature (68° C.) in 1 l of diisopropyl-ether. Over the period of 1 hour 91 ml (1 mol) phosphorous oxychloride are added in a drop-wise fashion. The mixture is kept at reflux for an additional 30 hours, whereby a strong HCl stream develops. After cooling to room temperature the ether phase is washed 4 times with 250 ml distilled $H_2O$ and subsequently dried with $CaCl_2$. After the ether has been removed a yellowish oily liquid remains, which crystallizes upon cooling to room temperature. The obtained crude product is dissolved in 150 ml isopropanol and the solution under strong stirring is added drop-wise to 3 l of distilled $H_2O$. The precipitated crude product is filtered off and dried at 50° C. in vacuum. Yield: 102.1 g=57.4% of theory; melting point: 112°–119° C.

2. Production of 1-(4-hydroxybenzoic acid)-2-hydroxy-3-methacryloyl-propane

A mixture of 71 g (0.5 mol) glycidylmethacrylate, 69 g (0.5 mol) p-hydroxybenzoic acid, 3.3 g p-methoxyphenol and 1.1 g benzyltriethylammoniumchloride is heated to 90° C. with stirring. The beginning reaction is noticeable by a strong heat of reaction. The temperature is kept at 120° C. with ice cooling. Then it is stirred for one more hour at 80° C. The compound forms as clear, slightly yellow, highly viscous substance, which becomes a glass upon cooling to room temperature.

The monomers may be used solely or in mixtures with one another.

In order to achieve certain properties, the monomers according to the invention can also be used in combination with other known monomers.

The total amount of monomers in the photopolymerizable mixture is 10 to 80% by weight of the total constituents of the mixture.

For the production of the photopolymerizable mixture all known water-insoluble binding agents can be used, which are soluble and/or capable of swelling in aqueous alkaline solutions. Such binding agents frequently contain groups which make them soluble in alkali such as acid anhydride-, carboxyl- or sulfonic acid groups. Examples for such binding agents are: polymers consisting of acrylic acid and/or methacrylic acid or their copolymers with other monomers, as for example acrylic acid esters or other acrylic derivatives, vinyl compounds, such as vinylether, vinylacetate or its saponification products, styrene, vinylpyrrolidone, butadiene and related monomers, polyacrylic acid anhydrides, copolymers of maleic acid anhydride, maleic acid, maleic acid halfesters, maleic acid halfamides and/or anhydrides and derivatives of related compounds, such as, for example, itaconic acid, with suitable comonomers, as for example styrene, vinylethers, vinylacetate etc.

The amount of the binding agent is generally 20–90% by weight of the total constituents of the mixture.

As photoinitiators practically all compounds known for this purpose can be used. The photoinitiator system initiating the addition polymerization can contain one or several compounds, which provide directly free radicals, if they are activated by radiation or after they have been excited by a sensitizer, which is activated by the radiation.

Examples of suitable photoinitiators and/or initiator systems are: benzophenone/Michler's ketone, hexaarylbisimidazole/mercaptobenzoxazole, substituted thioxanthone/tertiary amines, for example p-dimethylaminobenzoic acid ethylesters, and benzildimethylketal. Initiators with a ketal-structure or the system thioxanthone/tertiary amine were found to be particularly suitable.

The concentration of the photoinitiator system forming free radicals is preferably approximately 0.01 to 10% by weight of the total constituents of the mixture.

The photopolymerizable mixtures and the recording materials produced from it may contain further additives as, for example, dyes and pigments as well as other additives, such as plasticizers, adhesion promotors and the like.

The photopolymerizable mixtures according to the invention are preferably used in the form of light-sensitive layers, on suitable supports to form recording materials.

Suitable support materials are, for example, paper, metallic bases, glass and ceramic bases as well as synthetic film supports such as polyethylene, polypropylene, polycarbonate, polyamide, polyesters and the like.

The photopolymerizable mixtures according to the invention are used particularly advantageously for the production of resist materials.

For this purpose the light-sensitive mixture is applied to a transparent temporary support, preferably a synthetic film and, if necessary, a removable synthetic film is laminated on as cover sheet. For the production of the resist picture the cover sheet, if it is present, is then removed and the light-sensitive layer, situated on the temporary support, is laminated onto the permanent support, which is frequently a copper surface. The material is then exposed in a normal fashion. This can be carried out through the temporary support as well as after the removal of the temporary support in direct contact with the photopolymerizable mixture. If the exposure is made through the temporary support, the latter is removed after the exposure, and the exposed layer is developed.

The developing occurs by washing out the nonpolymerized parts of the image with aqueous-alkaline solutions according to known methods as such, for example spraying on, brushing out and the like. The pH-value of the solutions should be in the range of 9 to 11. Suitable alkalis for the developing solutions are alkali carbonates, borates, silicates and alkalihydroxides as well as the known carbonate-, borate- and phosphate buffer systems. The developer solutions can furthermore contain surface-active substances.

After the developing process, the material is then further processed in a conventional manner using known methods for plating or etching.

The polymerized layer remaining on the permanent support, can then be easily completely removed by treating it with an alkaline stripping solution, which has a pH-value of approximately 13. As stripping solutions, strongly alkaline aqueous solutions which contain between 1 and 20% by weight alkalihydroxide, are generally used. The stripping process occurs commonly at increased temperature between 30° and 90° C., preferably between 40° and 80° C., in continuous machines or tanks.

The described photopolymerizable mixtures and the recording materials produced thereof can be used for all known applications of relief materials. However, based upon their superior behavior, they are preferably used as resist materials for the production of printed circuits.

The superior stripping behavior is based on the fact that the polymer formed during the exposure swells because of the aromatic hydrophilic substituents in the stripping solution and suddenly breaks down into small particles, which do not lead to disturbances within the processing machines and which can be easily removed with the help of filters. On the basis of this decomposition of the exposed resist film the stripping process can occur first of all very quickly, generally approximately two to three times faster than with known resist materials. Secondly, critical places, that are areas with very fine line structure or strongly overplated areas, can be stripped without residues in this short period of time. With known resist materials, despite heavily spraying on of the stripping solution, parts of the resist frequently remain between the plated circuit lines and thus impair or make impossible the further processing of the circuit board, for example, etching away of the base copper.

The fact that it was possible to obtain resist materials with good wash out characteristics, a stable relief picture with the monomers described, and improved stripping behavior, was surprising in two regards.

Thus it was not expected that photopolymers containing aromatic hydrophilic substituents, would be sufficiently hydrophobic against aqueous alkaline developing solutions. That is, that they would neither be attacked during the development process nor that they would swell. However, it was surprising to find that, when using monomers containing aromatic hydroxyl-, mercapto- or sulfonamide groups, the swelling of aqueous-alkaline soluble binding agents in the developer could be reduced through exposure to such an extent that selective development to achieve a perfect, stable relief was possible.

It is generally known, for example from the DE-PS No. 10 98 197 and the U.S. Pat. No. 3,629,197 that compounds with aromatic hydroxyl groups are used as polymerization inhibitors and/or antioxidants, whereas compounds with aromatic mercapto groups are used for lowering the degree of polymerization. The expert thus had to expect that monomers which contain such groups crosslink only inadequately in the light-sensitive layer, so that the binding agent is at least partially washed out also in the exposed areas.

This prejudice is also confirmed by the DE-PS No. 12 32 020, DE-AS No. 15 22 362, and DE-OS No. 24 46 056.

In DE-PS No. 12 32 020 color-forming monomers are protected, which contain phenol- and naphthol rings as color-forming groups. From column 8 of this patent one can see that only a low degree of polymerization is achieved during the exposure and essentially only di- and trimers are formed. In other words, the exposed parts of the picture do not become insoluble, that is the layer is not crosslinked, but rather only the diffusion behaviour of the monomers is reduced. The development of the images occurs by leaching out the monomer at the unexposed areas using solvents which selectively dissolve the monomer, but not the binding agent, this means that at the obtained low degree of polymerization the formation of a relief is not possible.

From DE-AS No. 15 22 362 a photopolymerizable mixture is known, which contains as essential ingredients a binding agent with crosslinkable groups, for example an unsaturated polyester, a monomer and a photoinitiator. As suitable monomers vinylphenols and dihydroxystyrenes are mentioned. However, according to this patent application sufficient photocrosslinking is only achievable, if the binding agent contains a sufficiently high number of such crosslinkable groups, otherwise only a gel-like state can be reached, even with concurrent photopolymerisation of the monomer. Therefore it was not obvious, to use such monomers in combination with binding agents without crosslinkable groups for applications, requiring a high degree of crosslinking.

From DE-OS No. 24 46 056 fully aqueous developable photopolymerizable mixtures are known, which may contain among others monomers with an aromatic sulfonamide group. There is mentioned as a disadvantage, that these materials strongly swell in the developer solution. This indicates insufficient crosslinking of the layer which allows the developer solution to diffuse into the layer and to cause the swelling. Therefore one skilled in the art had to start from the fact that monomers with hydrophilic groups are not suitable for the needs according to this invention, because the required high degree crosslinking and hydrophobic behaviour of the exposed areas cannot be achieved.

The following examples shall further illustrate the invention.

EXAMPLES

EXAMPLE 1

A coating solution of the following composition:

| | |
|---|---|
| 80 ml | methylenechloride |
| 3 ml | methanol |
| 14.50 g | copolymer consisting of methylmethacrylate, ethylacrylate, acrylic acid (55/38/7 parts by weight) average molecular weight 30.000 |
| 5.40 g | 1-(p-hydroxybenzoic acid)-2-hydroxy-3-methacryloyl-propane |
| 6.60 g | hydroquinonemonomethacrylate |
| 1.20 g | benzildimethylketal |
| 0.025 g | Victoria blue, a triphenylmethane dye produced by reaction of 4.4-bis-(diethylamino)-benzophenone with N—ethyl-1-naphthylamine | is applied onto a polyethyleneterephthalate film in such a way that the layer thickness after drying is 40 $\mu$m. Subsequently a 25 $\mu$m thick, transparent polyethylene cover sheet is laminated onto it.

In order to further process the photoresist film is, after removal of the cover sheet, laminated onto a base material, covered with a 35 $\mu$m thick copper film at 60° C. and exposed through a line pattern (line widths of 25 $\mu$m–250 $\mu$m) with a metal halide lamp (1000 watt) for 65 seconds at a distance of 65 cm.

The development takes place with a spray processor with an aqueous $Na_2CO_3$-solution (1% by weight) for 40 seconds at 30° C.

A relief with a line resolution of 40 $\mu$m is obtained, the exposed parts of the image show no undercutting that is the resist edges are formed vertically. According to usual processes at first copper at a thickness of 50 $\mu$m and subsequently tin/lead at a thickness of 10 $\mu$m are plated. The overplating is approximately 20 $\mu$m.

For stripping the overplated board is dipped into a bath of an aqueous solution of KOH (3% by weight) at 60° C. After 20 seconds the polymerized layer begins to swell strongly and to break down into very small particles. After 30 seconds the plate is sprayed with a water jet. The resist layer is removed from the plate completely and without residues down to line widths of 75 $\mu$m. The base copper can then be etched away according to known processes.

A similarly overplated board is sprayed with an aqueous solution of KOH (2% by weight) at 60° C. in a stripping machine. After 26 seconds the polymerized layer is removed without residue in small easily removable particles down to line widths of 75 μm.

EXAMPLE 2

A coating solution of the following composition:

| | |
|---|---|
| 80 ml | methylenechloride |
| 8 ml | methanol |
| 14.85 g | copolymer consisting of methylmethacrylate, acrylic acid, t-octylacrylamide, hydroxypropylmethacrylate, t-butylaminoethylmethacrylate (35/16/40/5/4 parts by weight) |
| 4.85 g | triethyleneglycoldimethacrylate |
| 7.29 g | 1-(p-hydroxybenzoic acid)-2-hydroxy-3-methacryloyl-propane |
| 2.25 g | dimethylaminobenzoic acid ethylester |
| 0.9 g | chlorothioxanthone |
| 0.025 g | Victoria blue, a triphenylmethane dye produced by reaction of 4,4'-bis(diethylamino)-benzophenone with N—ethyl-1-naphthylamine | is applied onto a polyethyleneterephthalate film in such a way that the thickness of the layer after drying is 40 μm, then a 25 μm thick, transparent polyethylene cover sheet is laminated onto it.

For additional processing the photoresist film is, after removal of the cover sheet, laminated onto a base material covered with a 35 μm thick copper film at 60° C. and exposed for 35 seconds according to the data given in Example 1.

The development occurs with a spray processor with an aqueous Na2CO3-solution (1% by weight) for 40 seconds at 30° C.

A relief with a line resolution of 40 μm is obtained. The exposed parts of the image show no undercutting, that means the resist edges are formed vertically.

Then, according to customary processes, copper is at first plated at a thickness of 50 μm and subsequently tin/lead is plated at a thickness of 10 μm. The overplating is approximately 20 μm.

For stripping the overplated board is then dipped into a bath with 15% by weight KOH at 60° C. After 20 seconds the polymerized layer begins to swell strongly and starts to break down into very small particles. After 30 seconds the plate is sprayed with a water jet. The resist layer is removed from the plate completely and without residues down to line widths of 75 μm. The base copper can then be etched away according to known processes.

EXAMPLE 3

A coating solution of the following composition:

| | |
|---|---|
| 80 ml | methylenechloride |
| 3 ml | methanol |
| 14.6 g | copolymer consisting of methylmethacrylate, ethylacrylate, acrylic acid (55/38/7 parts by weight) average molecular weight 30.000 |
| 12.0 g | hydroquinonemonomethacrylate |
| 1.2 g | benzildimethylketal |
| 0.05 g | oracet blue, an aminoanthraquinone dye | is coated according to the data given in Example 1, provided with a cover sheet and laminated onto a base material covered with a copper film and is exposed for 90 seconds according to the data given in Example 1.

The development occurs with a spray processor with an aqueous Na2CO3-solution (1% by weight) for 36 seconds at 30° C.

A residue-free washed out negative of the pattern is obtained with a line resolution of 40 μm, then the base copper is etched away according to a known method in an etching machine with an alkaline etching solution. For stripping the etched plate is then dipped into a bath with 3% by weight KOH at 60° C. After 25 seconds the polymerized layer begins to swell strongly, separates from the surface and breaks down into small particles. After rinsing with a water jet a perfectly stripped board is obtained.

EXAMPLE 4

A coating solution of the following composition:

| | |
|---|---|
| 80 ml | methylenechloride |
| 8 ml | methanol |
| 10.6 g | copolymer consisting of methylmethacrylate, ethylacrylate acrylic acid (55/38/7 parts by weight) average molecular weight 30.000 |
| 2.7 g | copolymer consisting of methylmethacrylate, ethylacrylate, acrylic acid (71/17/12 parts by weight) average molecular weight 200.000 |
| 13.3 g | di-(2-hydroxy-3-methacryloylpropyl)-5-hydroxy-isophthalic acid ester |
| 2.75 g | benzildimethylketal |
| 0.025 g | Victoria blue, a triphenylmethane dye produced by reaction of 4.4'-bis(diethylamino)-benzophenone with N—ethyl-1-naphthylamine | is coated according to the data given in Example 1, provided with a cover sheet and laminated onto a base material covered with a copper film. Then the exposure and developing takes place according to the data given in Example 3.

The perfectly washed out negative of the pattern shows a line resolution of 40 μm.

According to customary methods copper is plated at a thickness of 50 μm. For stripping the plated board is dipped into a bath with 3% by weight KOH at 60° C. After 15 seconds the polymerized layer separates and breaks down into small particles. After rinsing with a water jet a perfectly stripped boards with a line resolution <80 μm is obtained.

EXAMPLE 5

A coating solution of the following comoosition:

| | |
|---|---|
| 80 ml | methylenechloride |
| 3 ml | methanol |
| 14.6 g | copolymer consisting of methylmethacrylate, ethylacrylate, acrylic acid (55/38/7 parts by weight) average molecular weight 30.000 |
| 5.4 g | 1-(p-hydroxybenzoic acid)-2-hydroxy-3-methacryloyl-propane |
| 6.6 g | p-hydroxymethacrylanilide |
| 1.2 g | benzildimethylketal |
| 0.05 g | oracet blue, an aminoanthraquinone dye | is coated according to the data given in Example 1, provided with a cover sheet and laminated onto a base material covered with a copper film, exposed for 180 seconds according to the data given in Example 1.

The development occurs with a spray processor with a solution of 1% by weight Na₂CO₃ for 30 seconds at 35° C.

The perfectly washed out negative of the pattern has vertically formed edges and a line resolution of 40 μm. Then copper is plated at a thickness of 50 μm according to customary methods. For stripping the plated board is dipped into a bath containing 3% by weight KOH. Already after 15 seconds the polymerized layer is removed in the form of very small particles from the finest image elements, larger image elements break down into very small particles after 20–25 seconds. After rinsing with a water jet a perfectly stripped board with a line resolution down to 75 μm is obtained.

EXAMPLE 6

A coating solution of the following composition:

| | | |
|---|---|---|
| 80 ml | methylenechloride | |
| 3 ml | methanol | |
| 14.60 g | coplymer consisting of methylmethacrylate, ethylacrylate, acrylic acid (55/38/7 parts by weight) average molecular weight 30.000 | |
| 1.2 g | benzildimethylketal | |
| 0.05 g | oracet blue, an aminoanthraquinone dye | | is divided into two parts A and B.

The following is added to part A 5.4 g
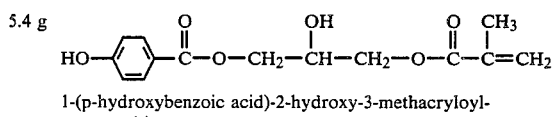
1-(p-hydroxybenzoic acid)-2-hydroxy-3-methacryloyl-propane (a)

and 6.6 g
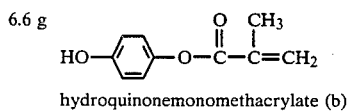
hydroquinonemonomethacrylate (b)

and the following is added to part B 5.4 g
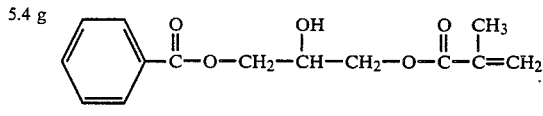
1-benzoic acid-2-hydroxy-3-methacryloyl-propane (c)

and 6.6 g
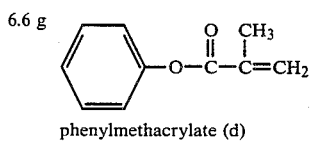
phenylmethacrylate (d)

the solutions are coated according to the data given in Example 1, provided with a cover sheet, laminated onto a base material covered with a copper film and exposed.

The development takes place with a spray processor with a 1% by weight Na₂CO₃-solution for 40 seconds at 30° C.

Then copper is plated at a thickness of 50 μm according to usual methods.

For the stripping the plates are dipped into a bath with 3% by weight KOH.

The stripping behavior of the plates A and B is summarized in Table 1:

TABLE 1

| | Stripping Behavior | | |
|---|---|---|---|
| Plate | Period of time in which the layers are stripped | Type | Strippable line Widths |
| A | 30 sec | very small particles | 75 μm |
| B | 60 sec | large pieces | 150 μm |

The table shows that the stripping can be carried out twice as fast and down to line widths of 75 μm when using the monomers according to the invention.

Concerning Plate B line widths below 150 μm cannot be stripped even after an immersion period of 100 seconds in the stripping solution.

EXAMPLE 7

A coating solution of the following composition:

| | |
|---|---|
| 90 ml | methylenechloride |
| 10 ml | methanol |
| 6.75 g | copolymer consisting of styrene and maleic acid anhydride, partially esterified with secondary butanol |
| 5.95 g | copolymer consisting of methylmethacrylate, ethylacrylate, acrylic acid (55/38/7 parts by weight) |
| 4.28 g | copolymer consisting of methylmethacrylate, ethylacrylate, acrylic acid (71/17/12 parts by weight) average molecular weight 200.000 |
| 1.0 g | benzildimethylketal |
| 0.18 g | methylthioxanthone |
| 0.85 g | dimethylaminobenzoic acid ethylester |
| 0.02 g | Victoria blue, a triphenylmethane dye produced by reaction of 4.4'-bis(diethylamino)-benzophenone with N—ethyl-1-naphthylamine | is divided into three parts A, B, and C.
The following is added to part A

| | |
|---|---|
| 6.27 g | trimethylolpropanetriacrylate and |
| 0.95 g | tricresylphosphate as plasticizer. |

Part B corresponds to part A with the exception that part B contains 3.8 g tricresylphosphate as plasticizer.

The following is added to part C

| | |
|---|---|
| 4.27 g | di-(2-hydroxy-3-acryloylpropyl)-5-hydroxy-isophthalic acid ester |
| 2.00 g | 1-(o-hydroxybenzoic acid)-2-hydroxy-3-methacryloyl-propane |
| 0.95 g | tricresylphosphate as plasticizer. |

The coating solutions are coated according to the data given in Example 1, provided with a cover sheet and laminated onto a base material covered with a copper film, which exhibits holes of a diameter of 1–6 mm and then they are exposed for 40 seconds according to the data given in Example 1.

The development takes place with a spray processor with a 1% by weight Na₂CO₃-solution for 60 seconds at 30° C.

A residue-free washed out negative of the pattern is obtained with a line resolution down to 40 μm. Subsequently the base copper is etched away according to a known method in an etching machine with an alkaline etching solution. For the stripping the 3 etched plates A, B and C are dipped into a bath of 3% by weight KOH at 60° C. The stripping behavior is summarized in the table:

TABLE 2

Stripping Behavior

| Plate | Period of time in which the layers are stripped | Type | diameter of the tented holes |
|---|---|---|---|
| A | 50 sec | large pieces | up to 6 mm |
| B | 30 sec | medium-sized | up to 3 mm |
| C | 20 sec | very small pieces | up to 6 mm |

The table shows that the time period in which the layers are removed can be reduced by an increased amount of plasticizer, whereby, however, the mechanical properties deteriorate to such an extent that holes can only be perfectly tented to a diameter of maximally 3 mm. On the other hand, when using the described monomers, it is possible to remove layers faster and in the form of easily removable small particles without impairing the mechanical properties.

EXAMPLE 8

A coating solution of the following composition:

| 80 ml | methylenechloride |
|---|---|
| 3 ml | methanol |
| 14.6 g | copolymer consisting of methylmethacrylate, ethylacrylate, acrylic acid (55/38/7 parts by weight) average molecular weight 10.000 |
| 12.0 g | 1-(hydroxy cinnamic acid)-2-hydroxy-3-methacryloyl-propane |
| 1.2 g | benzildimethylketal |
| 0.02 g | oracet blue, an aminoanthraquinone dye | is coated according to the data given in Example 1, provided with a cover sheet and laminated onto a base material covered with a copper film and exposed for 300 seconds according to the specifications given in Example 1.

The development takes place with a spray processor with a 1% by weight Na$_2$CO$_3$-solution for 42 seconds at 30° C.

The perfectly washed out negative of the pattern has vertically formed edges and a line resolution down to 40 μm.

The base copper is subsequently etched away according to a known method in an etching machine with an alkaline etching solution.

For the stripping the etched plate is dipped into a bath with 3% by weight KOH at 60° C. After 20 seconds the polymerized layer begins to swell strongly and breaks down into small particles. After rinsing with a water jet a perfectly stripped board is obtained.

EXAMPLE 9

A coating solution of the following composition:

| 80 ml | methylenechloride |
|---|---|
| 3 ml | methanol |
| 14.6 g | copolymer consisting of methylmethacrylate, ethylacrylate, acrylic acid (55/38/7 parts by weight) average molecular weight 30.000 |
| 6.0 g | 1-(2.4 dihydroxybenzoic acid)-2-hydroxy-3-methacryloyl-propane |
| 6.0 g | trimethylol-propane-triacrylate |
| 1.2 g | benzildimethylketal |
| 0.02 g | oracet blue, an aminoanthraquinone dye | is coated according to the data given in Example 1, provided with a cover sheet and laminated onto a base material covered with a copper film and exposed for 180 seconds according to the data given in Example 1.

The development takes place with a spray processor with a 1% by weight Na$_2$CO$_3$-solution for 30 seconds at 35° C.

The perfectly washed out negative of the pattern has vertically formed edges and a line resolution down to 40 μm.

Then copper and subsequently tin/lead are plated at a total thickness of 40 μm according to the usual methods. For stripping the plated board is dipped into a bath with 10% by weight KOH for 20 seconds and subsequently rinsed with a water jet, whereby the polymerized layer breaks down into very small particles. A perfectly stripped board with line widths down to 80 μm is obtained.

EXAMPLE 10

A coating solution of the following composition:

| 42 ml | methylenchloride |
|---|---|
| 3 ml | methanol |
| 4.04 g | copolymer consisting of styrene and maleic acid anhydride, partially esterified with secondary butanol average molecular weight 10.000 |
| 3.00 g | copolymer consisting of methylmethacrylate, ethylacrylate, acrylic acid (55/38/7 parts by weight) average molecular weight 30.000 |
| 2.25 g | copolymer consisting of methylmethacrylate, ethylacrylate, acrylic acid (71/17/12 parts by weight) average molecular weight 200.000 |
| 3.0 g | (4-methacrylamido)-benzene sulfonic acid anilide |
| 1.5 g | trimethylolpropanetriacrylate |
| 1.2 g | benzildimethylketal |
| 0.02 g | oracet blue, an aminoanthraquinone dye | is coated according to the data given in Example 1, provided with a cover sheet and laminated onto a base material covered with a copper film and exposed for 40 seconds according to the data given in Example 1.

The development takes place with a spray processor with a 1% by weight Na$_2$CO$_3$-solution for 120 seconds at 30° C.

The perfectly washed out negative of the pattern has vertically shaped edges and a line resolution better than 45 μm. Then copper is plated at a thickness of 50 μm according to the usual methods. For stripping the plated board is dipped into a bath of 3% by weight KOH at 60° C. After a reaction time of 10 seconds and subsequent rinsing with a water jet the polymerized layer separates completely from the plate and breaks down into small particles. A perfectly stripped board with line widths down to 75 μm is obtained and the base material can be etched away according to known methods.

EXAMPLE 11

A coating solution of the following composition:

| 42 ml | methylenechloride |
|---|---|

-continued

| | |
|---|---|
| 3 ml | methanol |
| 4.04 g | copolymer consisting of styrene and maleic acid anhydride, partially esterified with secondary butanol average molecular weight 10.000 |
| 3.00 g | copolymer consisting of methylmethacrylate, ethylacrylate, acrylid acid (55/38/7 parts by weight) average molecular weight 30.000 |
| 2.25 g | copolymer consisting of methylmethacrylate, ethylacrylate, acrylic acid (71/17/12 parts by weight) average molecular weight 200.000 |
| 3.0 g | 2-mercaptobenzoic acid-(2-hydroxy-3-methacryloxy-propyl)-ester |
| 1.5 g | trimethylolpropanetriacrylate |
| 1.2 g | benzildimethylketal |
| 0.02 g | oracet blue, an aminoanthraquinone dye | is coated according to the data given in Example 1, provided with a cover sheet and laminated onto a base material covered with a copper film and exposed for 80 seconds according to the specifications given in Example 1.

The developing takes place with a spray processor with a 1% by weight Na$_2$CO$_3$-solution for 120 seconds at 30° C.

The perfectly washed out negative image of the pattern has vertically shaped edges and a line resolution down to 40 μm.

Then copper is plated on at a thickness of 50 μm according to the usual methods. For stripping the plated board is dipped into a bath with 3% by weight KOH at 60° C. After a reaction time of 15 seconds and subsequent rinsing with a water jet the polymerized layer completely separates from the board in small particles. Line widths to 40 μm are resolved without residues and the base copper can be etched away according to known processes.

EXAMPLE 12

A coating solution of the following composition:

| | |
|---|---|
| 42 ml | methylenechloride |
| 3 ml | methanol |
| 4.04 g | copolymer consisting of styrene and maleic acid anhydride, partially esterified with secondary butanol average molecular weight 10.000 |
| 3.00 g | copolymer consisting of methylmethacrylate, ethylacrylate, acrylic acid (55/38/7 parts by weight) average molecular weight 30.000 |
| 2.25 g | copolymer consisting of methylmethacrylate, ethylacrylate acrylic acid (71/17/12 parts by weight) average molecular weight 200.000 |
| 3.0 g | o-vinylphenol |
| 1.5 g | trimethylolpropanetriacrylate |
| 1.2 g | benzildimethylketal |
| 0.02 g | oracet blue, an aminoanthraquinone dye | is coated according to the data given in Example 1, provided with a cover sheet and laminated onto a base material covered with a copper film and exposed for 180 seconds according to the data given in Example 1.

The developing takes place with a spray processor with a 1% by weight Na$_2$CO$_3$-solution for 120 seconds at 30° C.

The perfectly washed out negative image of the pattern has vertically shaped edges and a line resolution of 40 μm.

Then copper is plated on at a thickness of 50 μm according to the usual method. For stripping the plated board is dipped into a bath with 3% by weight KOH at 60° C. After a reaction time of 10 seconds and subsequent rinsing with a water jet the polymerized layer completely separates from the board in small particles. Line widths down to 75 μm are resolved without residue and the base copper is etched away according to known processes.

What is claimed is:

1. A photopolymerizable mixture comprising a water-insoluble, binding agent which is soluble or at least capable of swelling in aqueous-alkaline solutions, a photoinitiator or a photoinitiator system, one or several photopolymerizable ethylenically unsaturated monomers, characterized in that at least one of the photopolymerizable ethylenically unsaturated monomers contains at least one aromatic hydroxyl-, aromatic mercapto-, aromatic sulfonamide-or aromatic mono-N-substituted sulfonamide group, or combinations thereof.

2. Photopolymerizable mixture according to claim 1, characterized in that at least one of the photopolymerizable ethylenically unsaturated monomers corresponds to one of the following general formulas:

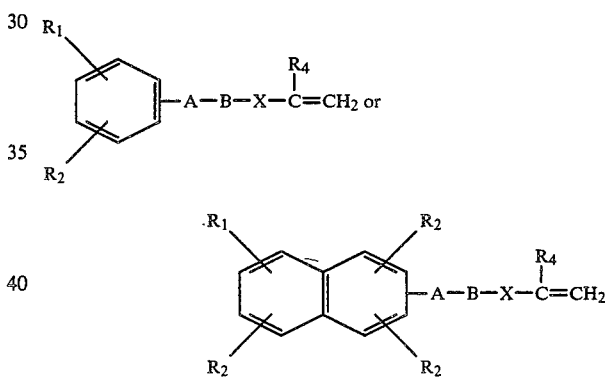

in which

A = a chemical bond; —O—;

$$-(CH_2)_{\overline{n}}-C\overset{O}{\underset{O-}{\diagup}} \quad ; \quad -(C_2H_2)_{\overline{n1}}-C\overset{O}{\underset{O-}{\diagup}} \quad ;$$

$$-(CH_2)_{\overline{n}}-C\overset{O}{\underset{NH-}{\diagup}} \quad ; \quad -(C_2H_2)_{\overline{n1}}-C\overset{O}{\underset{NH-}{\diagup}}$$

B = a chemical bond; —(CHR$_3$)$_n$—O—; —(C$_2$HR$_3$)$_n$—

X = a chemical bond;

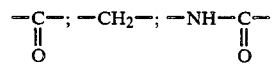

R$_1$ = —OH; —SH; —SO$_2$NHR$_5$—:
R$_2$ = H; alkyl with C$_1$-C$_4$; halide; R$_1$; oxyalkyl with C$_1$-C$_4$; nitro; —CN;

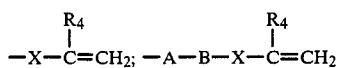

$R_3 = H$;

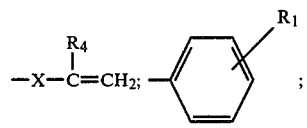

—OH; —SH; —NH$_2$;
$R_4 = H$; alkyl with $C_1$–$C_6$;

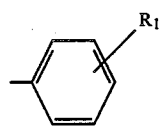

$R_5 = H$; alkyl with $C_1$–$C_6$; phenyl and phenyl substituted with $C_1$–$C_4$ alkyl
n = 0–6 and
n$_1$ = 1–2.

3. Photopolymerizable mixture according to claim 2, characterized in that it contains as photopolymerizable ethylenically unsaturated monomer p-hydroxymethacrylanilide, hydroquinonemonomethacrylate, 1-(4-hydroxybenzoic acid)-2-hydroxy-3-methacryloyl propane, 1-(2-hydroxybenzoic acid)-2-hydroxy-3-methacryloyl propane or di-(2-hydroxy-3-acryloyl propyl)-5-hydroxy-isophthalic acid ester.

4. Photopolymerizable mixture according to claim 2, characterized in that it contains at least one of a ketal or the system thioxanthone/tertiary amine as initiator or initiator system.

5. Photopolymerizable mixture according to claim 4, characterized in that it contains benzildimethylketal as initiator.

6. Light-sensitive recording material comprising a support, at least one photopolymerizable layer, characterized in that the photopolymerizable layer comprises the photopolymerizable mixture according to claim 1.

7. The recording material of claim 6 wherein the monomer corresponds to one of the following general formulas:

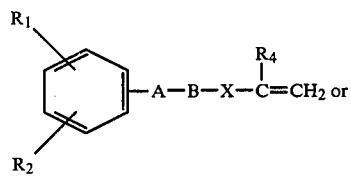

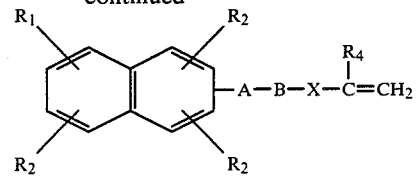

in which
A = a chemical bond; —O—;

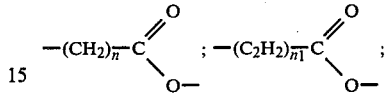

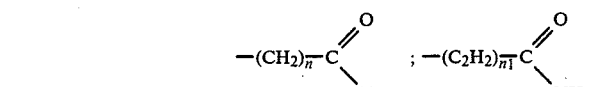

B = a chemical bond; —(CHR$_3$)$_n$—O—; —(C$_2$HR$_3$-)$_n$—
X = a chemical bond;

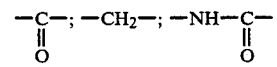

$R_1 = $ —OH; —SH; —SO$_2$NHR$_5$—,
$R_2 = H$; alkyl with $C_1$–$C_4$; halide; $R_1$; oxyalkyl with $C_1$–$C_4$; nitro; —CN;

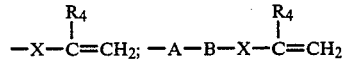

$R_3 = H$;

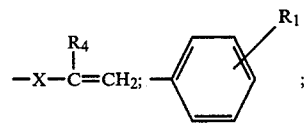

—OH; —SH; —NH$_2$;
$R_4 = H$; alkyl with $C_1$–$C_6$;

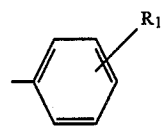

$R_5 = H$; alkyl with $C_1$–$C_6$; phenyl and phenyl substituted with $C_1$–$C_4$ alkyl
n = O–6
n$_1$ = 1–2

8. The recording material of claim 7 which contains as the monomer p-hydroxymethacrylanilide, hydroquinone monomethacrylate, 1-(4-hydroxybenzoic acid)-2-hydroxy-3-methacryloyl propane, 1-(2-hydroxybenzoic acid)-2-hydroxy-3-methacryloyl propane or di-(2-hydroxy-3-acryloyl propyl)-5-hydroxy-isophthalic acid ester.

9. The recording material of claim 7 which contains at least one of a ketal or the system thioxanthone/tertiary amine as initiator or initiator system.

10. The recording material of claim 5 which contains benzildimethylketal as initiator.

11. The recording material of claim 6 which contains a protective layer or a removable cover sheet.

* * * * *